(12) United States Patent
Lin et al.

(10) Patent No.: US 8,836,134 B2
(45) Date of Patent: Sep. 16, 2014

(54) SEMICONDUCTOR STACKED PACKAGE AND METHOD OF FABRICATING THE SAME

(71) Applicants: Po-Shen Lin, Jhongli (TW); Chuan-Jin Shiu, Jhongli (TW); Bing-Siang Chen, Jhongli (TW); Chen-Han Chiang, Jhongli (TW); Chien-Hui Chen, Jhongli (TW); Hsi-Chien Lin, Jhongli (TW); Yen-Shih Ho, Jhongli (TW)

(72) Inventors: Po-Shen Lin, Jhongli (TW); Chuan-Jin Shiu, Jhongli (TW); Bing-Siang Chen, Jhongli (TW); Chen-Han Chiang, Jhongli (TW); Chien-Hui Chen, Jhongli (TW); Hsi-Chien Lin, Jhongli (TW); Yen-Shih Ho, Jhongli (TW)

(73) Assignee: Xintec Inc., Jhongli (TW)

( * ) Notice: Subject to any disclaimer, the term of this patent is extended or adjusted under 35 U.S.C. 154(b) by 0 days.

(21) Appl. No.: 13/738,082

(22) Filed: Jan. 10, 2013

(65) Prior Publication Data
US 2013/0187263 A1 Jul. 25, 2013

Related U.S. Application Data

(60) Provisional application No. 61/584,901, filed on Jan. 10, 2012.

(51) Int. Cl.
*H01L 23/48* (2006.01)
*H01L 21/00* (2006.01)

(52) U.S. Cl.
USPC ........... 257/773; 257/620; 257/622; 257/730; 257/E23.022; 438/113; 438/460; 438/462

(58) Field of Classification Search
USPC ........... 438/113, 455, 457, 460, 462, 33, 458, 438/FOR. 368; 257/617, 618, E23.022, 622, 257/730, 773, 620
See application file for complete search history.

(56) References Cited

U.S. PATENT DOCUMENTS 5,869,888 A * 2/1999 Tsubosaki et al. ............ 257/692

* cited by examiner

*Primary Examiner* — Jasmine Clark
(74) *Attorney, Agent, or Firm* — Liu & Liu

(57) ABSTRACT

A method of fabricating a semiconductor stacked package is provided. A singulation process is performed on a wafer and a substrate, on which the wafer is stacked. A portion of the wafer on a cutting region is removed, to form a stress concentrated region on an edge of a chip of the wafer. The wafer and the substrate are then cut, and a stress is forced to be concentrated on the edge of the chip of the wafer. As a result, the edge of the chip is warpaged. Therefore, the stress is prevented from extending to the inside of the chip. A semiconductor stacked package is also provided.

10 Claims, 3 Drawing Sheets

SEMICONDUCTOR STACKED PACKAGE AND METHOD OF FABRICATING THE SAME

CROSS-REFERENCE TO RELATED APPLICATIONS

This application claims the benefit of U.S. Provisional Application No. 61/584,901, filed on Jan. 10, 2012, the entire contents of which is incorporated herein by reference.

BACKGROUND OF THE INVENTION

1. Field of the Invention

This invention relates to semiconductor wafers, and more particularly, to a semiconductor stacked package and a method of fabricating a semiconductor stacked package.

2. Description of Related Art

When the area of a plat semiconductor package is fully occupied by a variety of electronic elements, a wafer stacked technology is brought to the market. A plurality of similar or different chips may be stacked on one another, to achieve multi-functionality.

FIGS. 1A and 1B illustrate a method of fabricating a semiconductor stacked package 1 according to the prior art. A block layer 100 is formed on a glass board 10. A wafer 11 comprised of a plurality of chips 11' is stacked on the block layer 100. A cutting line L is formed among the chips 11'. Therefore, the wafer 11 can be cut into the plurality of chips 11'.

The wafer 11 includes a trace structure 110, and the trace structure 110 includes at least a dielectric layer 110a, a trace (not shown) formed on the dielectric layer 110a, and conductive pads 110b and 110c.

A one-time cutting process is performed along the cutting line L so as to form a plurality of semiconductor stacked packages 1.

Since the singulation process in the prior art is performed in one time, a stress applied to the chips 11' will extend and concentrate to a center of the chips 11'. As a result, a central region (indicated by a label K shown in FIG. 1C) of the chips 11' is easily cracked or damaged, and the chips 11' would even be useless.

Therefore, it is an important issue to overcome the problem of the prior art that a stress extends to the inside of the chips.

SUMMARY OF THE INVENTION

The present invention provides a semiconductor stacked package and a method of fabricating the semiconductor stacked package. A wafer is stacked on a substrate. A portion of the wafer is removed to form a cutting groove on a cutting line of the wafer. The substrate and the wafer are cut along the cutting groove so as to form a warpage on an edge of the chip.

In a semiconductor stacked package and a method of fabricating the semiconductor stacked package according to the present invention, a portion of the wafer is removed and the wafer is cut. Therefore, a stress is concentrated on an edge of the wafer where no trace is disposed, and does not extend to the inside of the chip. Accordingly, the risk of trace damage is reduced. As compared to the prior art that the wafer is cut in one time, the present invention provides a method of fabricating a semiconductor stacked package to avoid obtaining a useless semiconductor stacked package.

BRIEF DESCRIPTION OF DRAWINGS

The invention can be more fully understood by reading the following detailed description of the preferred embodiments, with reference made to the accompanying drawings, wherein.

DETAILED DESCRIPTION OF THE INVENTION

The following illustrative embodiments are provided to illustrate the disclosure of the present invention, these and other advantages and effects can be apparently understood by those in the art after reading the disclosure of this specification. The present invention can also be performed or applied by other different embodiments. The details of the specification may be on the basis of different points and applications, and numerous modifications and variations can be devised without departing from the spirit of the present invention.

FIGS. 2A to 2G are cross-sectional diagrams illustrating a method of fabricating a semiconductor stacked package 2 according to the present invention.

Figure 1A:
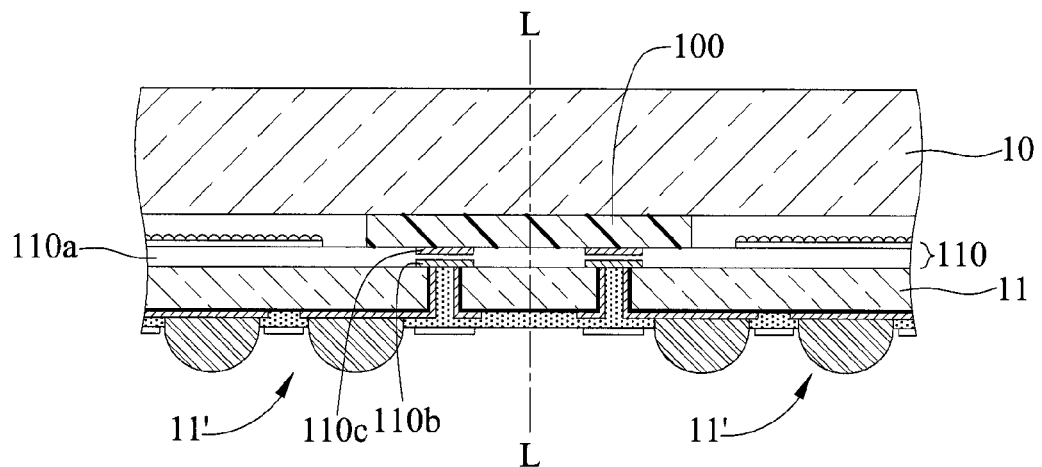
FIGS. 1A and 1B are cross-sectional diagrams illustrating a method of fabricating a semiconductor stacked package according to the prior art.
Figure 1B:
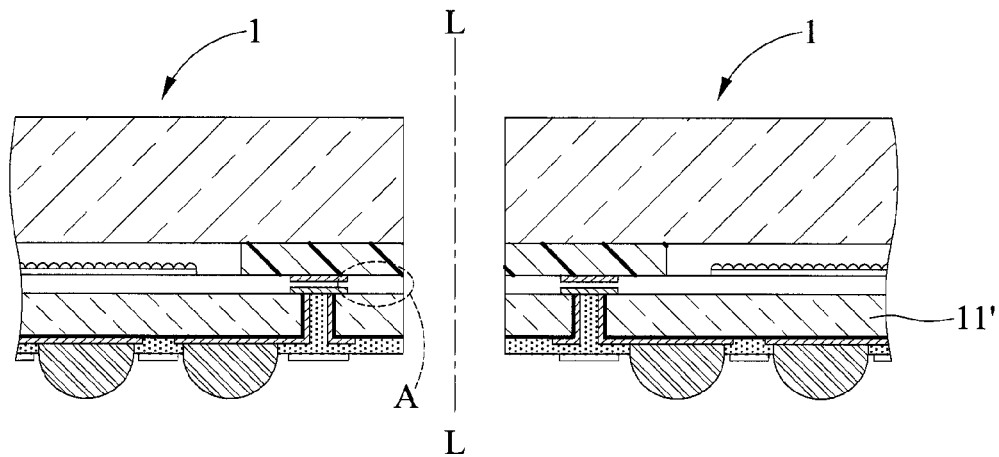
Figure 1C:
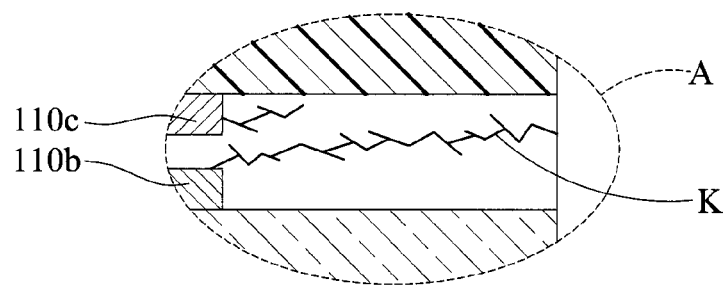
FIG. 1C is an enlarged view of a region A of FIG. 1B.
Figure 2A:
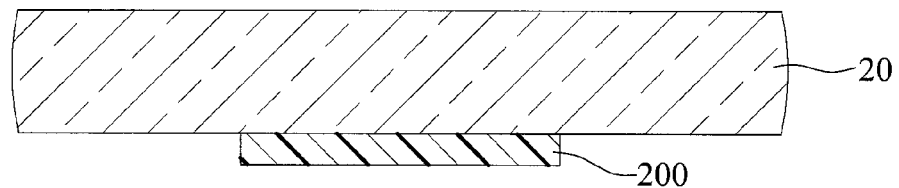
FIGS. 2A to 2G are cross-sectional diagrams illustrating a method of fabricating a semiconductor stacked package according to present invention.
Figure 2B:
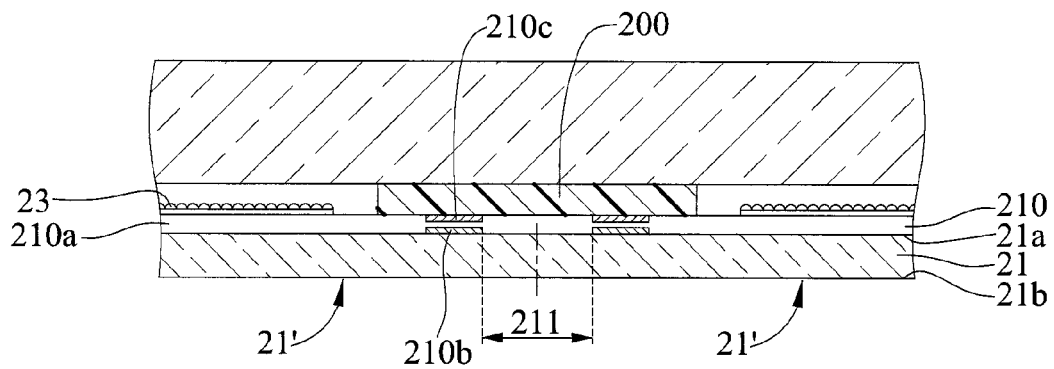

As shown in FIGS. 2A and 2B, a block layer 200 is formed on a substrate 20, and a wafer 21 is disposed on the block layer 200.

In an embodiment, the substrate 20 is made of glass or silicon, the wafer 21 has a micro electro mechanical system (MEMS) or an application specific integrated circuit (ASIC), and the block layer 200 is used as a supporting function and made of an oxide material or other materials.

In an embodiment, the wafer 21 is comprised of a plurality of chips 21', and has a first surface 21a for the substrate 20 to be mounted thereon, a second surface 21b opposing the first surface 21a, and both a trace structure 210 and a cutting region 211 disposed on the first surface 21a. The trace structure 210 has at least a dielectric layer 210a, a trace (not shown) formed on the dielectric layer 210a, and conductive pads 210b and 210c.

In an embodiment, a lens 23 is disposed on the trace structure 210 of the wafer 21, and a plurality of electronic elements (not shown) are installed in the wafer 21 for providing required functions. The electronic elements are in various types, and are not the technical features of the present invention, further description thereof hereby omitted.

Figure 2C:
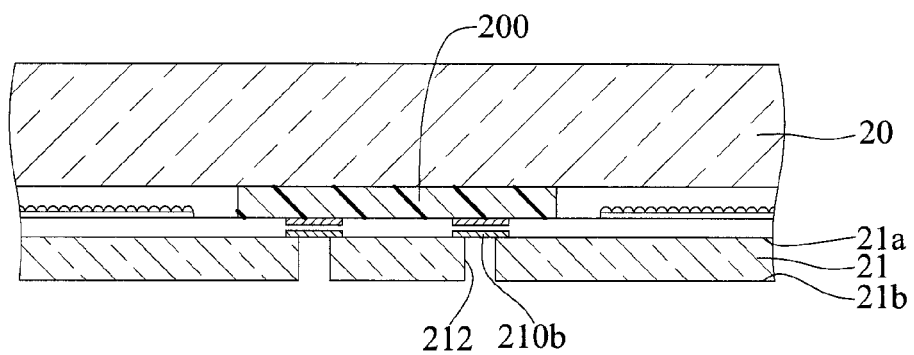

As shown in FIG. 2C, openings 212 are formed on the second surface 21b for exposing the conductive pads 210b from the openings 212.

Figure 2D:
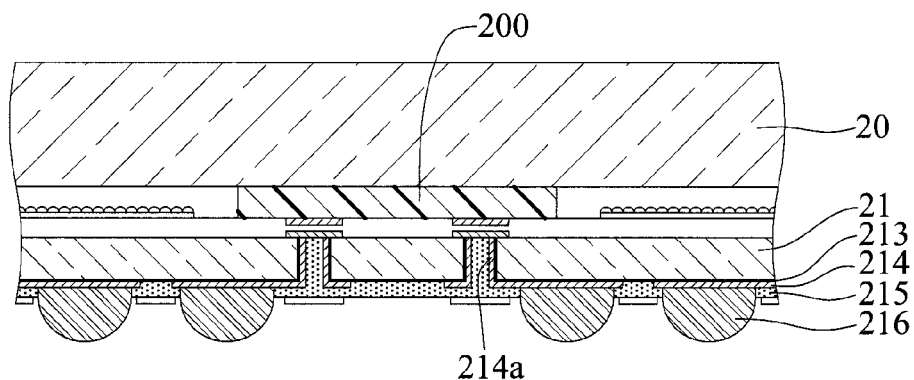

As shown in FIG. 2D, an insulation layer 213 is formed on the openings 212 and the second surface 21b, a trace layer 214 is formed on the insulation layer 213, and a conductive structure 214a is formed in the openings 212 and electrically connected to the trace layer 214.

A solder-resistant layer 215 is then formed on the trace layer 214 and the second surface 21b, so as to exposes a portion of a surface of the trace layer 214 for solder bumps 216 to be mounted thereto.

Figure 2E:
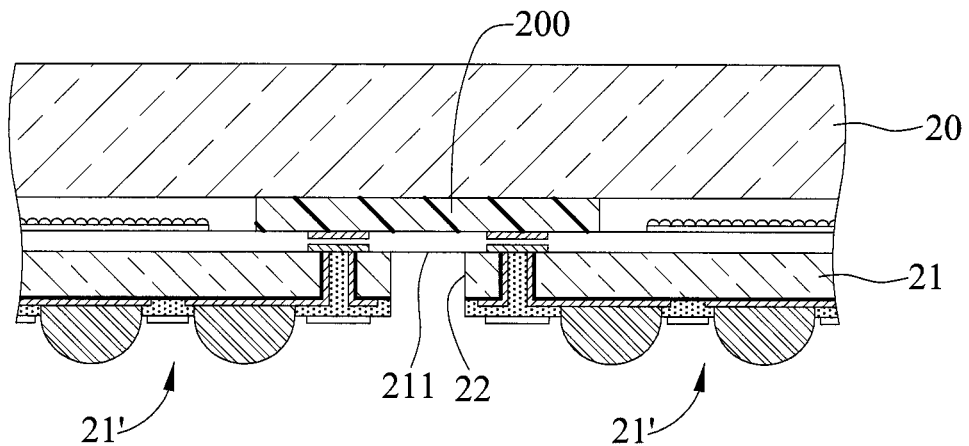

As shown in FIG. 2E, a portion of the wafer 21 is etched and removed to form a cutting groove 22 corresponding to the cutting region 211 and to expose the cutting region 211 from the cutting groove 22. The cutting groove 22 is disposed among the chips 21'.

Figure 2F:
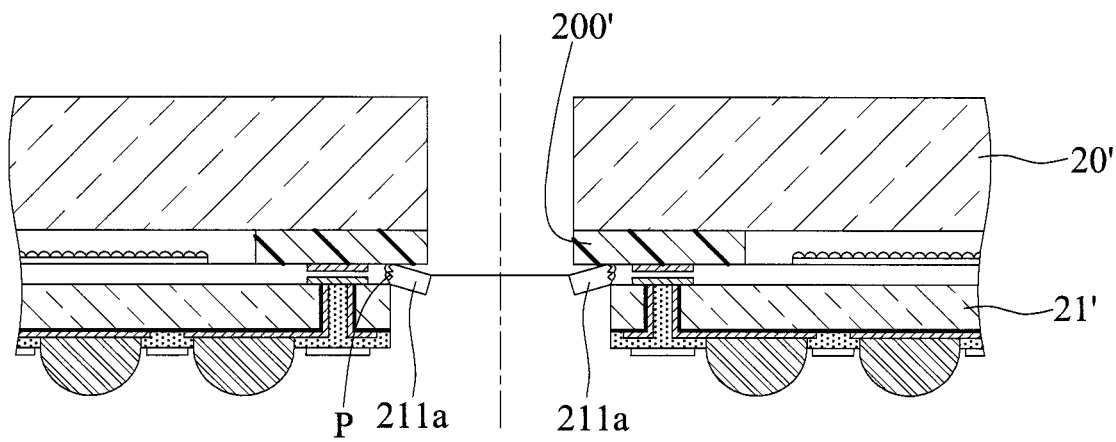
Figure 2G:
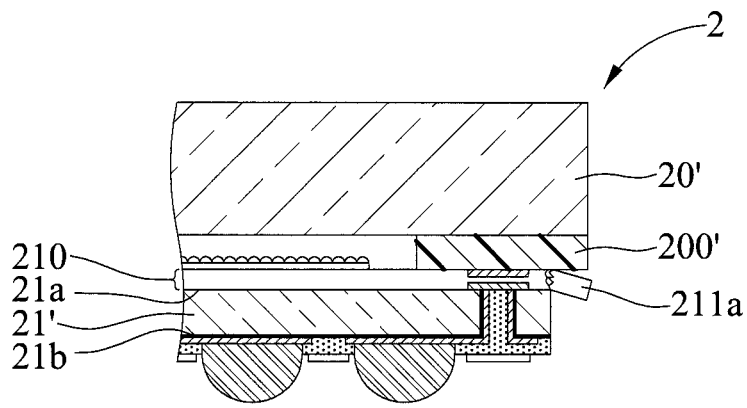

As shown in FIG. 2F, the wafer 21, the substrate 20 and the block layer 200 are cut along the cutting groove 22 to form on the cutting region 211 a stress concentrated region P and a warpage 211a. The warpage 211a is disposed on an edge of the chips 21'.

When a cutting process is performed on the semiconductor stacked package 2, an etching process is performed before the cutting process, such that the cutting region 211 is exposed on purpose when the etching process is performed. Therefore, a stress will be concentrated on an intersection of the cutting region 211 and the trace structure 210, and the cutting region 211 is thus cracked. As a result, the warpage 211a is formed on the edge of the chips 21'. Compared to the prior art that the wafer is cut in one time, a method of fabricating a semiconductor stacked package according to the present invention prevents a stress from extending to the inside of the chips 21', to avoid the trace of the trace structure 210 and the conductive pads 210b and 210c from damage. Therefore, it is prevented from obtaining a useless semiconductor stacked package 2.

The present invention further provides a semiconductor stacked package 2, including a substrate 20' and a chip 21' having a first surface 21a and a second surface 21b opposing the first surface 21a.

The semiconductor stacked package 2 can be applied to an MEMS, especially to an image sensor that senses electrical or capacitive variances. In an embodiment, the semiconductor stacked package 2 is applied to a semiconductor package fabricated by a wafer scale package (WSP) process, such as an image sensing element, an RF circuit, an accelerator, a gyroscope, a micro actuator, and a process sensor.

A block layer 200' is formed on the substrate 20'.

The first surface 21a of the chip 21' is disposed on the block layer 200', a trace structure 210 is disposed on the first surface 21a of the chip 21', and a warpage 211a is disposed on an edge of the first surface 21a of the chip 21'.

According to a semiconductor stacked package and a method of fabricating the semiconductor stacked package of the present invention, an etching process is performed before a cutting process, and a stress applied to the wafer will be concentrated to an edge of the chip during the cutting process. Therefore, a layout region of the chip will not be cracked, to avoid a trace disposed on the chip from damage.

The foregoing descriptions of the detailed embodiments are only illustrated to disclose the features and functions of the present invention and not restrictive of the scope of the present invention. It should be understood to those in the art that all modifications and variations according to the spirit and principle in the disclosure of the present invention should fall within the scope of the appended claims.

What is claimed is:

1. A semiconductor stacked package, comprising:
   a substrate; and
   a chip having a first surface attached onto the substrate, a second surface opposing the first surface, and a trace structure formed on the first surface, wherein the trace structure is formed with a warpage portion at a position that extends beyond an edge of the chip.

2. The semiconductor stacked package of claim 1, wherein a stress applied onto the chip is subject to being concentrated on the warpage portion.

3. The semiconductor stacked package of claim 1, further comprising a block layer formed between the substrate and the chip.

4. The semiconductor stacked package of claim 1, wherein the substrate is made of glass or silicon.

5. A method of fabricating a semiconductor stacked package, comprising the steps of:
   mounting on a substrate a wafer having a first surface mounted on the substrate, a second surface opposing the first surface, a trace structure formed on the first surface and at least a cutting region on the first surface;
   removing a portion of the wafer to form a cutting groove corresponding to the cutting region for exposing the cutting region from the cutting groove; and
   cutting the substrate and the wafer along the cutting groove to form on the cutting region a stress concentrated region, so as for the trace structure to be formed with a warpage portion at a position that extends into the cutting region.

6. The method of claim 5, further comprising forming a block layer between the substrate and the wafer.

7. The method of claim 6, wherein the block layer is cut when the substrate and the wafer are cut.

8. The method of claim 5, wherein the substrate is made of glass or silicon.

9. The method of claim 5, wherein the wafer comprises a plurality of chips.

10. The method of claim 9, wherein the cutting groove is formed between any two adjacent ones of the chips, and the warpage portion is disposed on an edge of the chips after cutting the substrate and the wafer.

* * * * *